United States Patent
Gupta et al.

(10) Patent No.: US 6,291,028 B1
(45) Date of Patent: *Sep. 18, 2001

(54) METHOD AND APPARATUS FOR IMPROVING THE FILM QUALITY OF PLASMA ENHANCED CVD FILMS AT THE INTERFACE

(75) Inventors: Anand Gupta, San Jose; Virendra V. S. Rana, Los Gatos, both of CA (US); Amrita Verma, Pittsburgh, PA (US); Mohan K. Bhan; Sudhakar Subrahmanyam, both of Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/608,786

(22) Filed: Jun. 30, 2000

Related U.S. Application Data (63) Continuation of application No. 08/599,270, filed on Feb. 9, 1996, now Pat. No. 6,121,163.

(51) Int. Cl.[7] .......................... C23C 16/505; C23C 16/00
(52) U.S. Cl. ....................................... 427/564; 118/723 E
(58) Field of Search .................... 438/788, 792; 118/695, 723 E, 696, 723 I, 697, 715, 719; 156/345; 427/569, 571, 573, 574

(56) References Cited

U.S. PATENT DOCUMENTS

| | | | |
|---|---|---|---|
| 4,761,219 | 8/1988 | Sasaki et al. | 204/298 |
| 4,795,529 | 1/1989 | Kawasaki et al. | 156/643 |
| 4,871,416 | 10/1989 | Fukuda | 156/635 |

(List continued on next page.)

FOREIGN PATENT DOCUMENTS

| | | | |
|---|---|---|---|
| 4128779 | 8/1991 | (DE) | C23F/4/00 |
| 0425419 | 2/1991 | (EP) | C23C/16/50 |
| 0453780 | 10/1991 | (EP) | H01J/37/32 |
| 60-42831 | 8/1983 | (JP) | H01L/21/302 |
| 61-196538 | 2/1985 | (JP) | H01L/21/302 |
| 63-1035 | 6/1986 | (JP) | H01L/21/302 |

OTHER PUBLICATIONS

Selwyn et al., "In–situ Particulate Contamination Studies in Process Plasmas," *SPIE Conference Proc.*, pp. 1–12, (Oct. 1989).

Selwyn, "Laser Diagnostic Techniques for Reactive Ion Etching: Plasma Understanding to Process Control," *J. Vac. Sci. Technol. A*, vol. 6, No. 3, pp. 2041–2046, (May/Jun. 1988).

"IBM Reveals Design for Self–Cleaning Tools," *Semiconductor International*, p. 46, (Sep. 1991).

Selwyn et al., "In Situ Plasma Contamination Measurements by HeNe Laser Light Scattering: A Case Study," *J. Vac. Sci. Technol. A*, vol. 8, No. 3, p. 1726, (May/Jun. 1990).

(List continued on next page.)

*Primary Examiner*—Gregory Mills
*Assistant Examiner*—P. Hassanzadeh
(74) *Attorney, Agent, or Firm*—Townsend & Townsend & Crew (57) ABSTRACT

A method and apparatus for depositing a layer having improved film quality at an interface. The method includes the steps of introducing an inert gas into a processing chamber and forming a plasma from the inert gas by applying RF power to the chamber at a selected rate of increase. After RF power has reached full power, a process gas including a reactant gas is introduced to deposit the layer. In a preferred embodiment, the reactant gas is tetraethoxysilane. In another preferred embodiment, the process gas further includes fluorine.

4 Claims, 6 Drawing Sheets

U.S. PATENT DOCUMENTS

| | | | |
|---|---|---|---|
| 4,951,601 | 8/1990 | Maydan et al. | 118/719 |
| 4,985,112 | 1/1991 | Egitto et al. | 156/643 |
| 4,985,372 | 1/1991 | Narita | 437/192 |
| 5,043,300 | 8/1991 | Nulman | 437/200 |
| 5,083,865 | 1/1992 | Kinney et al. | 356/338 |
| 5,089,441 | 2/1992 | Moslehi | 437/225 |
| 5,102,496 | 4/1992 | Savas | 156/643 |
| 5,143,866 | 9/1992 | Matsutani | 437/187 |
| 5,328,555 | 7/1994 | Gupta | 156/643 |
| 5,427,621 | 6/1995 | Gupta | 134/1 |
| 5,441,596 | 8/1995 | Nulty | 156/643.1 |
| 5,456,796 | 10/1995 | Gupta et al. | 156/643.1 |
| 5,563,105 | 10/1996 | Dobuzinsky et al. | 437/240 |
| 5,571,576 | 11/1996 | Quian et al. | 427/574 |
| 5,811,323 | 9/1998 | Miyasaka et al. | 438/151 |

OTHER PUBLICATIONS

"Pump/Purge Procedure Using Neon Feedstock," *IBM Technical Disclosure Bulletin*, vol. 34, No. 11, pp. 237–238, (Apr. 1992).

Selwyn, "Plasma Particulate Contamination Control 1. Transport and Process Effects," *J. Vac. Sci. Technol. B.*, vol. 9, No. 6, pp. 3487–3492, (Nov./Dec. 1991).

Selwyn et al., "Plasma Particulate Contamination Control: II. Self Cleaning Tool Design," *Journal of Vacuum Technology A (Vacuums, Surfaces and Films)*, vol. 10, No. 8, pt. 1, pp. 1053–1059, (Jul. 1992).

METHOD AND APPARATUS FOR IMPROVING THE FILM QUALITY OF PLASMA ENHANCED CVD FILMS AT THE INTERFACE

CROSS-REFERENCE TO RELATED APPLICATIONS

This application is s continuation of U.S. application Ser. No. 08/599,270 filed on Feb. 9, 1991, now U.S. Pat. No. 6,121,163.

BACKGROUND OF THE INVENTION

The present invention relates to the deposition of thin films during wafer processing. More specifically, the present invention relates to a method and apparatus for improving the quality of a film's interface when the film is deposited by plasma enhanced chemical vapor deposition methods.

One of the primary steps in the fabrication of modern semiconductor devices is the formation of a thin film on a semiconductor substrate by chemical reaction of gases. Such a deposition process is referred to as chemical vapor deposition or "CVD." Conventional thermal CVD processes supply reactive gases to the substrate surface where heat-induced chemical reactions take place to produce a desired film. The high temperatures at which some thermal CVD processes operate can damage device structures having metal layers. Plasma enhanced CVD (PECVD) processes on the other hand, promote excitation and/or disassociation of the reactant gases by the application of radio frequency (RF) energy to a reaction zone proximate the substrate surface, thereby creating a plasma of highly-reactive ionic species. The high reactivity of the released species reduces the energy required for a chemical reaction to take place, and thus lowers the required temperature for such CVD processes. The relatively low temperature of a PECVD process makes such processes ideal for the formation of insulating layers over deposited metal layers and for the formation of other insulating layers.

Semiconductor device geometries have dramatically decreased in size since such devices were first introduced several decades ago. Since then, integrated circuits have generally followed the two year/half-size rule (often called "Moore's Law") which means that the number of devices which will fit on a chip doubles every two years. Today's wafer fabrication plants are routinely producing 0.5 and even 0.35 micron feature size devices, and tomorrow's plants soon will be producing devices having even smaller geometries.

As device sizes become smaller and integration density increases, issues which were not previously considered important by the industry are becoming of concern. One such issue is the resistance of deposited films to defects such as cracking, void formation or the like which may be caused by phenomenon such as outgassing. One particular source of outgassing molecules is the initially deposited interface of film. Generally, the interface of the film has more impurities and imperfections than the bulk layer of the film and is therefore more porous than the bulk of the film. The porous nature of the film interface leads to unstable atoms which are not tightly bound within the silicon lattice structure. Thus, the film interface may be a source of outgassing molecules or atoms. The porous interface may also be a source of moisture collection.

In prior art devices, one source of impurities at the film interface is from incomplete reactions that occur in the plasma as RF power is increased to full power. For example, in deposition of a silicon oxide layer, a plasma is formed from a process gas released into a processing chamber by applying RF power to the chamber. In known prior art processes, the process gas is introduced into the chamber and then RF power is applied. While it generally only takes a matter of seconds for RF power to be ramped up from off to full power, reactions that take place during this period of partial power tend to be incomplete, thus depositing a film having a relatively high impurity level as compared to the film deposited under full RF power.

From the above it can be seen that a film having an improved film quality at the interface is necessary to keep pace with emerging technologies. It can also be seen that a method is needed to stabilize silicon oxide and similar films and prevent moisture absorption and outgassing in the films.

SUMMARY OF THE INVENTION

The present invention addresses the above problems of the prior art by providing an insulating layer having improved film quality at the interface. The present invention also provides a method and apparatus for forming such an insulating layer.

In particular, the present invention provides a method of reducing the incomplete reactions described above by delaying the introduction of reactant gases until after the plasma has been brought to full power. Specifically, in one embodiment of the method of the present invention, a plasma is formed from an inert gas introduced into the processing chamber. RF power used in plasma formation is brought from off to full power with the inert gas in the chamber. Once RF power reaches its full power, reactant gases are introduced.

In a preferred embodiment of the present invention, a first reactant gas, which by itself is an insufficient source for deposition, is introduced along with the inert gas until RF power is brought to full power. After full RF power is reached, remaining reactant gases are introduced to effect plasma deposition.

In another embodiment of the present invention, the total flow rate at which gases are introduced into the chamber while RF power is being brought to full power is substantially equal to the total flow rate at which gases are introduced into the chamber to deposit the bulk film layer.

These and other embodiments of the present invention along with many of its advantages and features are described in more detail in conjunction with the text below and attached figures.

DETAILED DESCRIPTION OF THE PREFERRED EMBODIMENTS

I. Exemplary CVD System

Figure 1:
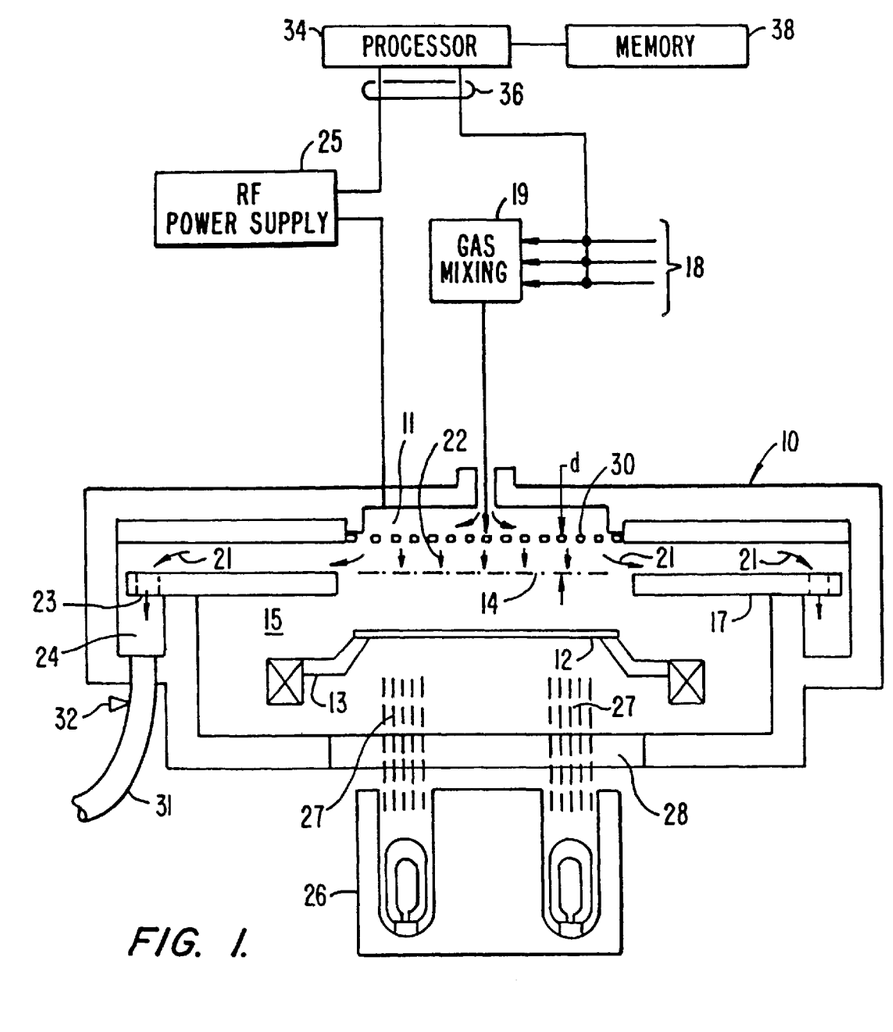
FIG. 1 is a vertical, cross-sectional view of one embodiment of a simplified chemical vapor deposition apparatus according to the present invention.

FIG. 1 illustrates one embodiment of a simplified, parallel plate plasma enhanced chemical vapor deposition (PECVD) system 10 having a vacuum chamber 15 in which the dielectric layer according to the present invention can be deposited. Reactor 10 contains a gas distribution manifold 11 for dispersing deposition gases to a wafer, not shown, that rests on a susceptor 12. Susceptor 12 is highly thermally responsive and is mounted on support fingers 13 so that susceptor 12 (and the wafer supported on the upper surface of susceptor 12) can be controllably moved between a lower loading/off-loading position and an upper processing position 14 which is closely adjacent manifold 11.

When susceptor 12 and the wafer are in processing position 14, they are surrounded by a baffle plate having a plurality of spaced holes 23 which exhaust into an annular vacuum manifold 24. Deposition and carrier gases are supplied through gas lines 18 into a mixing chamber 19 where they are combined and then sent to manifold 11. During processing, gas supplied to manifold 11 is uniformly distributed radially across the surface of the wafer as indicated by arrows 21. The gas is then exhausted via ports 23 into the circular vacuum manifold 24 and out an exhaust line 31 by a vacuum pump system (not shown). The rate at which gases are released through exhaust line 31 is controlled by a throttle valve 32.

A controlled plasma is formed adjacent to the wafer by RF energy applied to manifold 11 from RF power supply 25. Gas distribution manifold 11 is also an RF electrode, while susceptor 12 is grounded. RF power supply 25 can supply either single or mixed frequency RF power (or other desired variation) to manifold 11 to enhance the decomposition of reactive species introduced into chamber 15.

A circular external lamp module 26 provides a collimated annular pattern of light 27 through quartz window 28 onto an annular outer peripheral portion of susceptor 12. Such heat distribution compensates for the natural heat loss pattern of the susceptor and provides rapid thermal and uniform susceptor and wafer heating for effecting deposition.

A motor, not shown, raises and lowers susceptor 12 between a processing position 14 and a lower, wafer-loading position. The motor, gas supply valves connected to gas lines 18, throttle valve and RF power supply 25 are controlled by a processor 34 over control lines 36 of which only some are shown. Processor 34 operates under the control of a computer program stored in a memory 38. The computer program dictates the timing, mixture of gases, chamber pressure, chamber temperature, RF power levels, susceptor position, and other parameters of a particular process.

Typically, any or all of the chamber lining, gas inlet manifold faceplate, support fingers 13, and various other reactor hardware are made from material such as aluminum or anodized aluminum. An example of such a PECVD apparatus is described in U.S. Pat. No. 5,000,113 entitled "Thermal CVD/PECVD Reactor and Use for Thermal Chemical Vapor Deposition of Silicon Dioxide and In-situ Multi-step Planarized Process," which is commonly assigned.

The above CVD system description is mainly for illustrative purposes, and other plasma CVD equipment such as electron cyclotron resonance (ECR) plasma CVD devices, induction coupled RF high density plasma CVD devices, or the like may be employed. Variations of the above described system such as variations in susceptor design, heater design, location of RF power connections and others are also possible. For example, the wafer could be supported and heated by a resistively heated susceptor. The dielectric layer and method for forming such a layer of the present invention is not limited to any specific apparatus or to any specific plasma excitation method.

II. Improving Film Quality of Films Deposited By Plasma Enhanced CVD Methods The present invention may be employed to improve film quality at the interface of films deposited by plasma enhanced CVD methods. Specifically, improved quality at the film interface is accomplished by a novel procedure that introduces reactant gases after the plasma is brought to a selected full power level. By delaying the introduction of reactant gases until after a full plasma is reached, the amount of incomplete reactions that occur is reduced which thereby improves the film interface.

Figure 2:
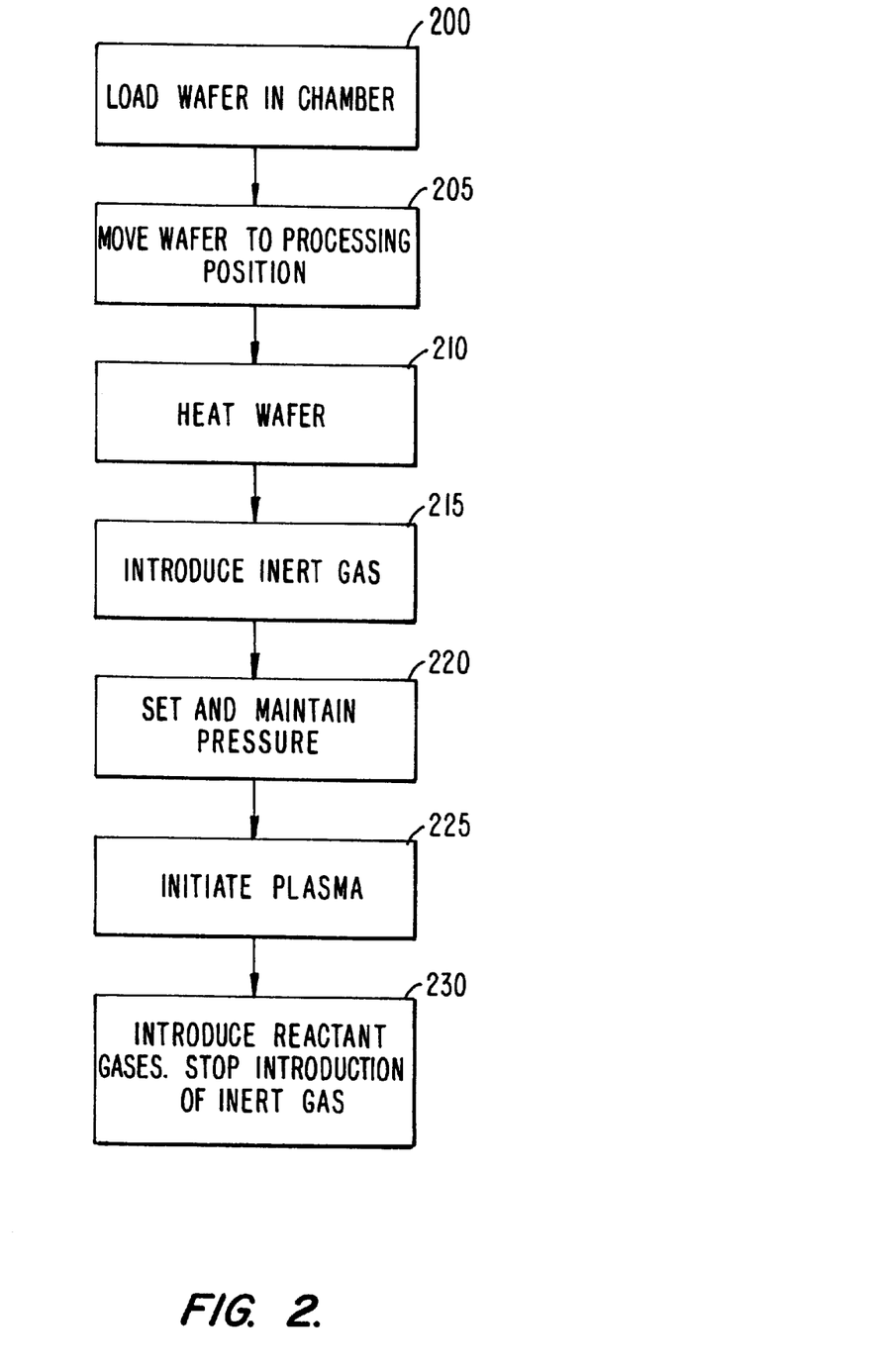
FIG. 2 is a flow chart illustrating one embodiment of the method of the present invention.

In one embodiment of the method of the present invention, film quality at the interface of an $SiF_4$-FSG film is improved. According to this embodiment, a wafer is loaded in vacuum chamber 15 through a vacuum-lock door and placed onto susceptor 12 (FIG. 2, step 200). The susceptor is then moved into processing position 14 (step 205). In processing position 14, the wafer is positioned between about 200–600 mils from gas distribution manifold 11.

Once the wafer is properly positioned, the wafer and susceptor are heated to a temperature of between 200–500° C. (step 210) and an inert gas is introduced into the reaction chamber from the gas distribution manifold (step 215). The gas introduced in step 215 may be any nonreactive gas; however, helium is introduced in a preferred embodiment. Because of its atomic weight, helium is less likely to have a sputtering effect on the wafer than a heavier inert gas such as argon. Once the inert gas is introduced, a selected pressure of between about 1–100 torr is set and maintained in the chamber by throttle valve 32 in conjunction with the vacuum pump system and the introduction of the inert gas (step 220).

Using a single or mixed frequency RF power supply, RF power is then supplied to generate a plasma (step 225). It generally takes several seconds or more for RF power to reach full power (the power level at which the RF power supply is driven at during step 230) from an OFF state. Of course, the actual time taken to reach full power depends on the RF ramp up rate and the full power level employed. RF power may be ramped up at a rate of between 50 Watts/second and 900 Watts/second. The rate at which RF power is increased can be constant during the ramp up period or may be varied throughout the period. Preferably, RF power is ramped up at a rate of between 50 Watts/second and 600 Watts/second, and most preferably at a rate of less than about 200 Watts/second. Ramping RF power up at a lower rate generates less particles and results in a stronger interface. If a mixed frequency power supply is used, the power supply is driven at a high frequency of 13.56 MHz at between 0–1200 Watts and at a low frequency of about 350 KHz at between about 0–500 Watts.

After the plasma has reached its full strength, a process gas including reactant gases is introduced into the chamber and flow of the inert gas is stopped (step 230) to deposit an FSG film. The process gas in this embodiment includes a gaseous mixture comprising $SiF_4$ as a source of fluorine, TEOS as a source of silicon, and one or more gaseous sources of oxygen. TEOS, which is in liquid form at room temperature, is vaporized by a liquid injection valve and combined with an inert gas such as helium before being combined with the process gas. The inert gas combined with the vaporized TEOS may be the same gas on the same gas line as the gas introduced in step 215 or may be from a separate gas line.

The rate at which various precursor gases in the process gas are introduced depends on the desired film properties, chamber volume and other factors. In one embodiment employing the exemplary CVD system described above as outfitted for 200 mm wafers, the flow rate of TEOS into the injection valve is between about 400–1500 mgm. $SiF_4$ is introduced at a flow rate of between 100–2500 sccm, while oxygen in the form of $O_2$ or a similar source is introduced at a rate of between about 300–3000 sccm. The total gas flow into the gas mixing chamber and through the gas distribution manifold is between about 1000 and 5000 sccm.

In a preferred version of the above embodiment, an amount of oxygen in the form of $O_2$, such as between 50–700 sccm (or between 0.015–1:1 oxygen to helium), is introduced into the chamber along with the inert gas in step 215. Then, in step 230, the amount of oxygen is increased to the level appropriate for the specific process. Having a continuous flow of at least one gas from step 215 to step 230 ensures that the plasma is not extinguished when flow of the inert gas is stopped and generates a more uniform plasma. Of course, depending on the process used, the gas common to both steps may be an oxygen source other than $O_2$ such as $N_2O$, ozone or a similar gas or may be a different gas altogether. It is important, however, that the gases introduced in step 215 do not react to deposit material on the substrate. Thus, for example, TEOS, which contains both silicon and oxygen that can react under plasma conditions to form a silicon dioxide layer, should not be introduced along with the inert gas in step 215.

In another preferred embodiment, the rate at which the inert gas or the combined rate at which the inert gas and oxygen or other gas is introduced during step 215 is substantially equal to the rate at which the process gas is introduced in step 230. For example, if a particular process calls for $SiF_4$ to be introduced into the chamber at a rate of 800 sccm, TEOS to be introduced at a rate of 600 mgm and oxygen to be introduced at a rate of 700 sccm, then in step 220, the rate at which the inert gas (or the combined rate of the inert gas and oxygen or other gas) is introduced should be approximately 2100 sccm. Maintaining such a uniform gas flow between steps 220 and 230 provides for a more uniform deposition.

In still another embodiment where fluorine or other doped silicon oxide films are deposited, step 230 is broken into separate steps in which a precursor gas containing the fluorine or other dopant source is introduced after the silicon source. Thus, in the above $SiF_4$-FSG example, TEOS is introduced into the chamber in step 230 between about 1–10 seconds before $SiF_4$ is introduced. Such a sequence deposits a very thin silicon oxide layer at the interface and helps ensure that fluorine will not be loosely bound at the interface.

Of course the method of the present invention is not intended to be limited to the above embodiments. For example, while $SiF_4$ was employed as the fluorine source in the above embodiment, other fluorine sources such as $C_2F_6$, TEFS or the like may be employed as the fluorine source. Also, oxygen and silicon sources other than $O_2$ or TEOS may be employed. In other embodiments, $SiH_4$ or other silicon sources may be used while $N_2O$, $O_3$ or similar oxygen sources may be used.

Additionally, while the method of the present invention was illustrated above with respect to a fluorine doped silicon oxide film, the present invention may be used to improve the film quality of other silicon oxide films formed under plasma conditions, such as undoped silicate glass (USG), phosphosilicate glass (PSG) and boron phosphosilicate glass (BPSG) as well as others. In these embodiments for example, a phosphorus source would be employed rather than a fluorine source to deposit a PSG film, or the process gas could include silicon and oxygen and not include fluorine to deposit USG film. The present invention can also be employed for plasma deposition of silicon nitride, silicon oxynitride or any other plasma enhanced deposited layer.

Accordingly, it is understood that the parameters listed in the above process should not be limiting to the claims as described herein. One of ordinary skill in the art can also use other chemicals, processing parameters, and processing conditions to practice the present invention.

III. Exemplary Structure

Figure 3:
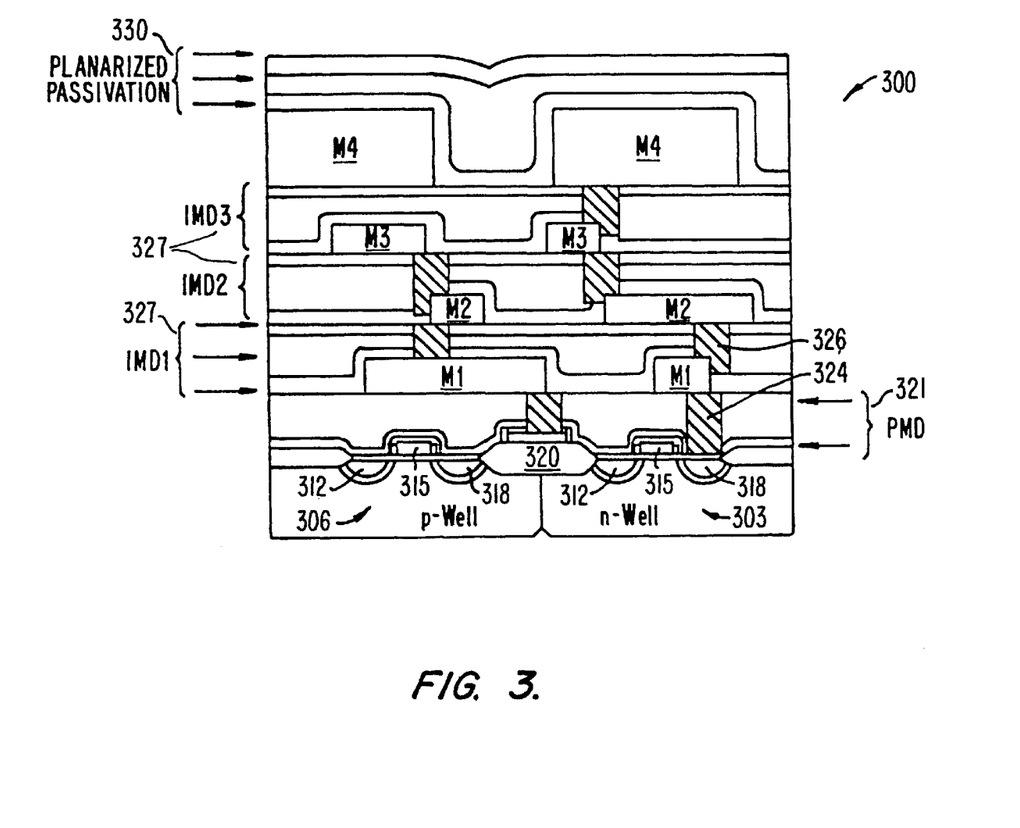
FIG. 3 is a simplified cross-sectional view of a semiconductor device manufactured according to the method of the present invention.

FIG. 3 illustrates a simplified cross-sectional view of an integrated circuit 300 according to the present invention. As shown, integrated circuit 300 includes NMOS and PMOS transistors 303 and 306, which are separated and electrically isolated from each other by a field oxide region 320. Each transistor 303 and 306 comprises a source region 312, a drain region 315 and a gate region 318.

A premetal dielectric layer 321 separates transistors 303 and 306 from metal layer M1 with connections between metal layer M1 and the transistors made by contacts 324. Metal layer Ml is one of four metal layers, M1–M4, included in integrated circuit 300. Each metal layer M1–M4 is separated from adjacent metal layers by respective intermetal dielectric layers 327 (IMD1, IMD2 and IMD3). Adjacent metal layers are connected at selected openings by vias 326. Deposited over metal layer M4 are planarized passivation layers 330.

The layer of the present invention may find uses in each of the dielectric layers shown in integrated circuit 300. The layer of the present invention may also be used in damascene layers which are included in some integrated circuits. In damascene layers, a blanket layer is deposited over a substrate, selectively etched through to the substrate and then filled with metal and etched back or polished to form metal contacts such as M1. After the metal layer is deposited, a second blanket deposition is performed and selectively etched. The etched areas are then filled with metal and etched back or polished to form vias 326.

It should be understood that the simplified integrated circuit 300 is for illustrative purposes only. One of ordinary skill in the art could implement the present method for fabrication of other integrated circuits such as microprocessors, application specific integrated circuits (ASICS), memory devices, and the like.

IV. Test Results and Measurements

To prove the effectiveness of the present invention, experiments were performed depositing a fluorine-doped silicon oxide film without the benefit of the method of the present invention and depositing a fluorine-doped silicon oxide film according to the method of the present invention. The experiments were performed in a lamp heated, DCVD Precision 5000 processing chamber manufactured by Applied Materials outfitted for 200 mm wafers. In each experiment, a fluoro silicate glass (FSG) layer was deposited onto a low resistivity silicon wafer.

For the first experiment, the $SiF_4$-FSG film was deposited without the benefit of the method of the present invention. Specifically, the wafer was loaded into the processing chamber and moved into a processing position 250 mils from the gas distribution manifold. Once the wafer was properly positioned, it was heated to a temperature of 400° C. A process gas including $SiF_4$, TEOS and $O_2$ was then introduced into the chamber. TEOS was introduced at a rate of 915 mgm, oxygen ($O_2$) was introduced at a rate of 700 sccm and $SiF_4$ was introduced at a rate of 725 sccm. Pressure within the chamber was set and maintained at 5 torr and a plasma was formed using a high frequency of 13.56 MHz driven at 110 Watts and a low frequency of 350 KHz powered at 340 Watts. The plasma was maintained until a 3000 Å FSG layer was deposited.

Figure 4:
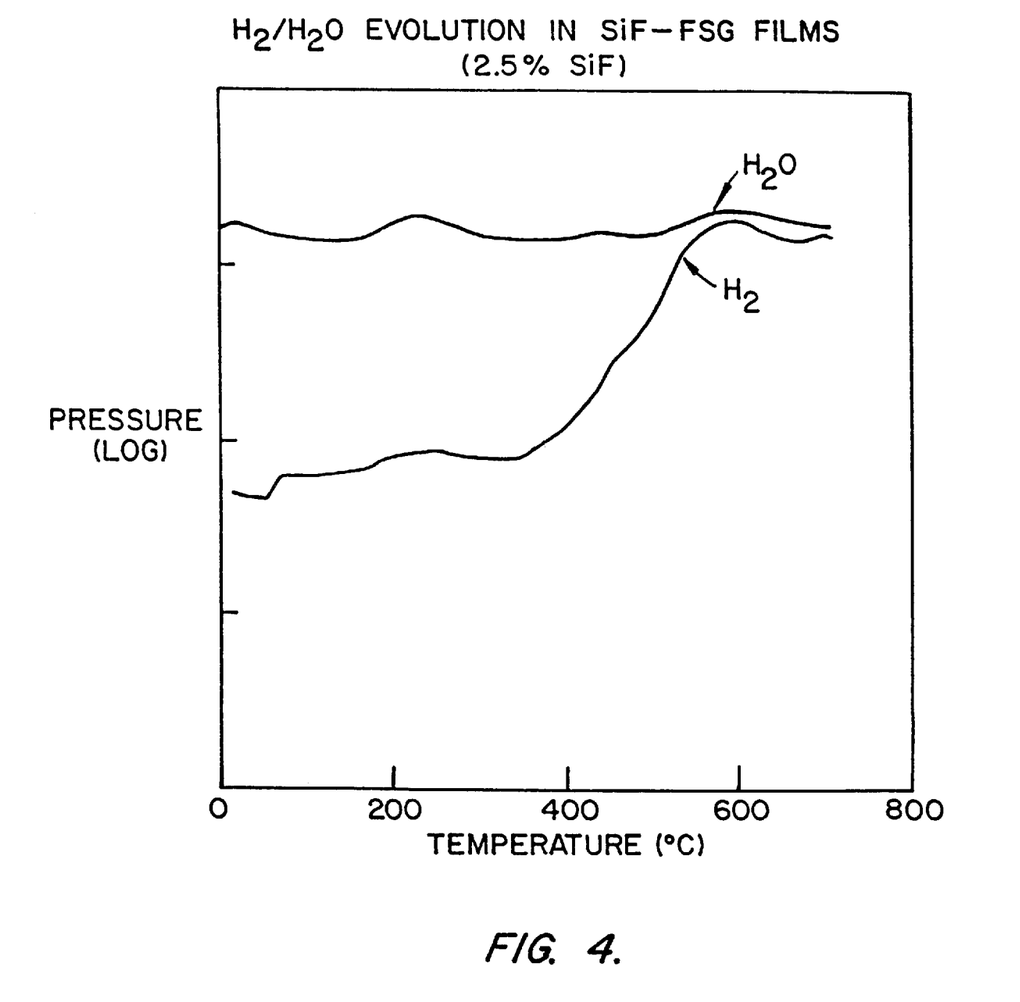
FIG. 4 is a graph showing $H_2O$ and $H_2$ evolution in a 2.5 weight percent $SiF_4$-FSG film that is not deposited according to the method of the present invention.

The above process conditions resulted in an FSG film having 2.5% SiF as measured by Fourier transform infrared (FTIR) spectroscopy of the peak ratio of SiF bonds to (SiF+SiO) bonds. To evaluate the stability of the deposited film, thermal desorption data (TDS) measurements were taken as is well known to those of ordinary skill in the art. FIG. 4 is a graph showing $H_2O$ and HF evolution in the $SiF_4$-FSG film deposited as described above. The graph shows $H_2$ outgassing from within the film at about 380° C. It is believed that the source of this $H_2$ is at or near the film interface.

For the second experiment, an $SiF_4$-FSG film was deposited according to the method of the present invention. For this deposition process, the wafer was loaded into the processing chamber and moved into a processing position 250 mils from the gas distribution manifold. After being properly positioned, the wafer was heated to a temperature of 400° C. Then, an inert gas including helium and oxygen was introduced into the chamber. The gas was introduced at a rate of 1400 sccm of which 700 sccm of the flow was $O_2$ and 700 sccm of the flow was helium.

Pressure within the chamber was set and maintained at 5 torr and a plasma was formed using a high frequency of 13.56 MHz driven at 110 Watts and a low frequency of 350 KHz powered at 340 Watts. In forming the plasma, RF power. was applied at a rate of 100 Watts/second. After the RF power reached full power (approximately 3 and ½ seconds), oxygen flow rate was increased to 700 sccm, vaporized TEOS was introduced at a rate of 915 mgm, $SiF_4$ was introduced at a rate of 725 sccm and the flow of helium was stopped. The plasma was maintained until a 2458 Å FSG layer was deposited.

Figure 5:
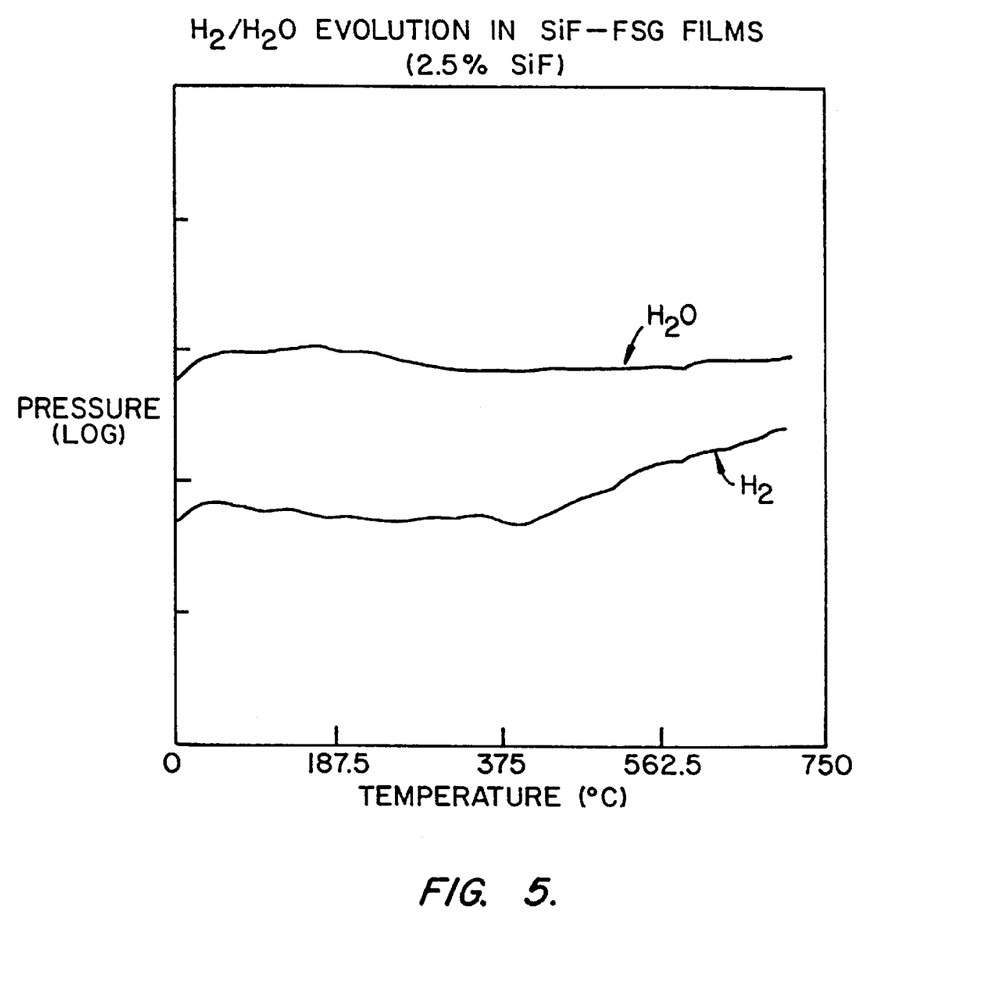
FIG. 5 is a graph showing $H_2O$ and $H_2$ evolution in a 2.5 weight percent $SiF_4$-FSG film deposited according to the method of the present invention.

The above process conditions resulted in an FSG film having 2.5% SiF. As shown in FIG. 5, which is a thermal desorption data graph showing $H_2O$ and $H_2$ evolution in the $SiF_4$-FSG film deposited as described above, there was less $H_2$ outgassing in this film than in the film of the first experiment.

In another set of experiments, gas chromatography mass spectrometry (GCMS) measurements were taken on films deposited with and without the benefits of the present invention. The results of these experiments are shown in FIGS. 6(a) and 6(b) which illustrate the outgassing of $SiF_4$ as determined by GCMS measurements of $SiF_3$ ions.

Figure 6A:
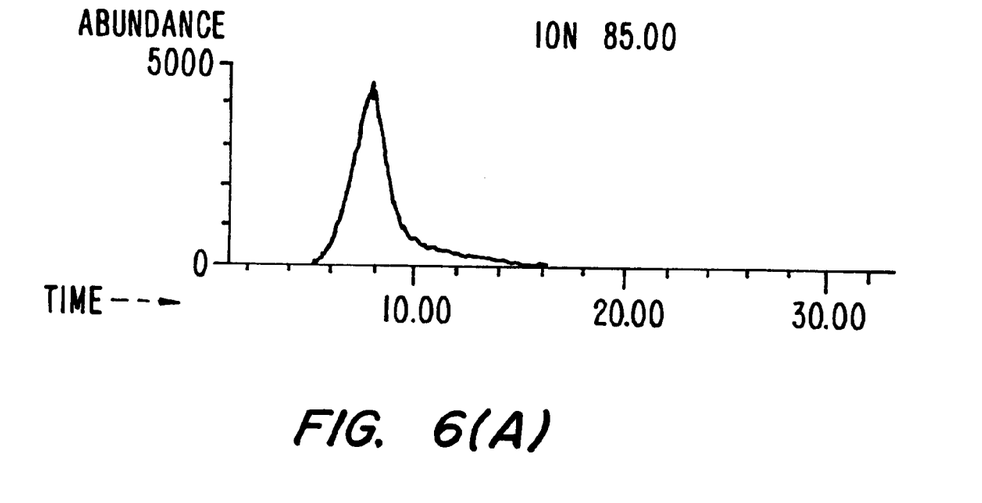
FIGS. 6(a) and 6(b) are graphs showing the evolution of $SiF_4$ on films deposited with and without the benefit of the present invention.

For the test results in FIG. 6(a), an $SiF_4$-FSG film was deposited on a low resistivity silicon wafer. The wafer was positioned 250 mils from the gas distribution manifold, and heated to a temperature of 400° C. A process gas including $SiF_4$, TEOS and $O_2$ was introduced into the chamber. TEOS was introduced at a rate of 915 mgm, oxygen ($O_2$) was introduced at a rate of 700 sccm and $SiF_4$ was introduced at a rate of 1700 sccm. The pressure within the chamber was set and maintained at 5 torr and a plasma was formed using a high frequency of 13.56 MHz driven at 110 Watts and a low frequency of 350 KHz powered at 340 Watts to deposit a 5000 Å FSG layer.

Figure 6B:
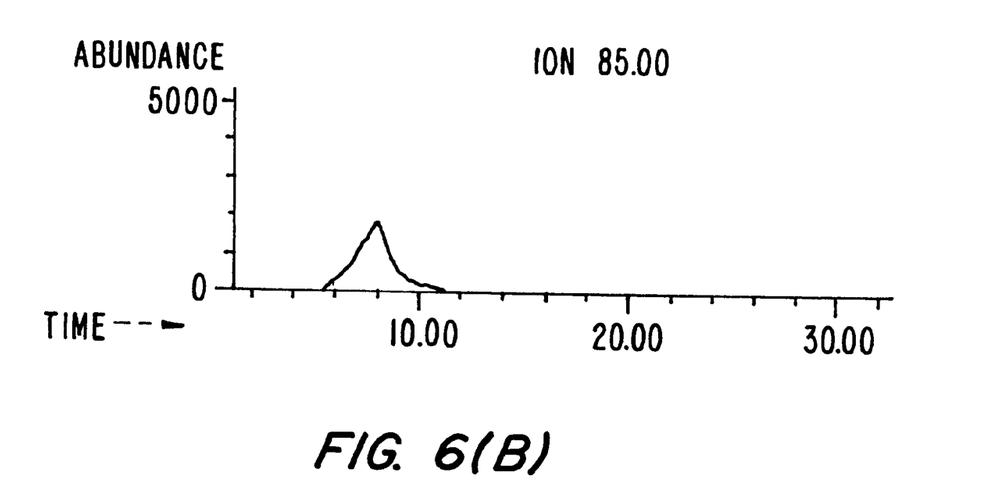

For the test results in FIG. 6(b), the same process was used except that a plasma was initially formed from the helium and oxygen and brought up to full RF power. After full RF power was reached (approximately 3 ½ seconds), TEOS and $SiF_4$ were introduced in the process gas and the plasma was maintained to deposit a 5000 Å FSG layer.

The above process conditions resulted in FSG films having 4.5% SiF. In this set of experiments, wafers on which the films were deposited were heated to a temperature of 400 degrees Celsius for a 30 minute period. GCMS measurements were taken during this 30 minute to determine the amount of $SiF_4$ outgassing from the films. While the amount of such outgassing molecules is measured in arbitrary units, the measurements illustrate the amount of outgassing $SiF_4$ molecules in the film of FIG. 6(a) relative to the amount of outgassing $SiF_4$ molecules in the film of FIG. 6(b). Thus, as shown in FIGS. 6(a) and 6(b), more $SiF_4$ was detected outgassing from the film deposited according to conventional methodology than from the film deposited according to the method of the present invention. It is believed that the better quality of the film deposited on the wafer tested for the results depicted in FIG. 6(b) is due to a stronger interface of the film.

Having fully described several embodiments of the present invention, many other equivalent or alternative methods of depositing the low dielectric constant oxide layer according to the present invention will be apparent to those skilled in the art. For example, while the illustrated embodiments concerned a process using TEOS as a source of silicon and $O_2$ as a source of oxygen, it is possible to use other sources silicon sources such as silane, and other oxygen sources such as $N_2O$, CO or others. These alternatives and equivalents are intended to be included within the scope of the present invention.

What is claimed is:

1. A method for depositing a layer on a substrate disposed in a parallel plate, capacitively coupled plasma substrate processing chamber, said method comprising:

(a) placing a substrate in a substrate processing chamber;

(b) during a first deposition stage, flowing an inert gas and a first reactant gas into the chamber, forming a plasma within said chamber from said inert gas and said first reactant gas with RF energy and ramping said RF power to full power at a selected rate of increase, wherein constituents from said inert gas and said first reactant gas do not react to deposit material on the substrate; and (c) during a second deposition stage after said first deposition stage and after said RF power reaches substantially full power, flowing a second reactant gas into the chamber to initiate deposition of the layer over the substrate.

2. The method of claim 1 wherein said plasma is formed in said substrate processing chamber between first and second electrodes by application of RF energy to at least one of said electrodes.

3. A method for depositing a silicon oxide layer on a substrate disposed in a substrate processing chamber, said method comprising:

(a) placing a substrate in the substrate processing chamber;

(b) during a first deposition stage, flowing an inert gas and an oxygen-containing gas into the chamber, forming a plasma within said chamber from said gases with RF energy and ramping said RF power to full power at a selected rate of increase; and (c) during a second deposition stage after said first deposition stage and after said RF power reaches substantially full power, flowing a silicon-containing gas into the chamber to initiate deposition of a silicon oxide layer over the substrate.

4. The method of claim 3 wherein a fluorine-containing gas is also flowed into said deposition zone after said RF power reaches substantially full power.

* * * * *